(12) United States Patent  
Sosnowski

(10) Patent No.: US 7,084,369 B2  
(45) Date of Patent: Aug. 1, 2006

(54) HARMONIC MULTIPLEXER

(75) Inventor: Janusz Sosnowski, Chandler, AZ (US)

(73) Assignee: Tokyo Electron Limited, Tokyo (JP)

( * ) Notice: Subject to any disclaimer, the term of this patent is extended or adjusted under 35 U.S.C. 154(b) by 336 days.

(21) Appl. No.: 10/644,063

(22) Filed: Aug. 20, 2003

(65) Prior Publication Data

US 2004/0065539 A1   Apr. 8, 2004

Related U.S. Application Data

(60) Provisional application No. 60/404,413, filed on Aug. 20, 2002.

(51) Int. Cl.  
*B23K 9/00* (2006.01)

(52) U.S. Cl. .......................... 219/121.43; 219/121.41; 156/345.48; 156/345.24; 204/298.34

(58) Field of Classification Search .......... 219/121.59, 219/121.41, 121.4, 121.43, 121.44; 156/345.45, 156/345.48, 345.24; 204/298.34; 118/723 I  
See application file for complete search history.

(56) References Cited

U.S. PATENT DOCUMENTS

| | | | | |
|---|---|---|---|---|
| 6,887,339 | B1 * | 5/2005 | Goodman et al. | 156/345.28 |
| 6,902,646 | B1 * | 6/2005 | Mahoney et al. | 156/345.24 |
| 2003/0022466 | A1 * | 1/2003 | Escalera et al. | 438/478 |
| 2005/0151489 | A1 * | 7/2005 | Lys et al. | 315/308 |

* cited by examiner

*Primary Examiner*—Mark Paschall  
(74) *Attorney, Agent, or Firm*—Pillsbury Winthrop Shaw Pittman LLP

(57) ABSTRACT

A method and apparatus for maintaining a plasma in a plasma region, by supplying RF power at a fundamental frequency to the plasma region together with a gas in order to create an RF electromagnetic field which interacts with the gas to create a plasma that contains electromagnetic energy components at frequencies that are harmonics of the fundamental frequency. The energy components at frequencies that are harmonics of the fundamental frequency are monitored and controlled by placing a harmonic multiplexer containing a matching network and RF filter elements in energy receiving communication with the plasma.

16 Claims, 7 Drawing Sheets

HARMONIC MULTIPLEXER

This non-provisional application claims the benefit of U.S. Provisional Application No. 60,404,413, filed on Aug. 20, 2002, the content of which is incorporated in its entirety herewith.

FIELD OF THE INVENTION

The present invention relates to plasma processing systems, particularly to monitoring and controlling the magnitude of harmonics in plasma processing systems.

BACKGROUND OF THE INVENTION

In the semiconductor fabrication industry, capacitively coupled plasma sources are widely used for dry etching and plasma enhanced chemical deposition. Dry etching is a process for removing a layer of material from a wafer surface. This removal is a result of combined mechanical and chemical effects of high-energy plasma ions striking the wafer surface. In plasma enhanced chemical deposition, a layer of a material is deposited on the wafer surface. This material is introduced into the plasma either by sputtering a target made of the material or by supplying a gas which contains the material or from which the material is produced by a chemical reaction. The material may be ionized by the plasma and can then be attracted to the wafer by an electric field.

Plasma acts as a nonlinear RF circuit element and thus acts as a source of harmonics of the fundamental excitation frequency. These harmonics, due to their higher frequencies, have an even higher power coupling efficiency to the plasma than the fundamental. Therefore, harmonics, even if present at very low power levels, can significantly affect process uniformity due to their very unfavorable wavelength-to-wafer-diameter ratio.

Since harmonics of the RF fundamental excitation frequency have comparatively short wavelengths, they are far more likely to set up resonances in various places in the process chamber, RF transmission lines, cavities, etc., since their half-wavelengths are comparable to the dimensions of these places.

SUMMARY OF THE INVENTION

According to the invention, a monitoring assembly for monitoring a plasma process in a plasma processing chamber includes a harmonic multiplexer adapted to communicate energy to and from the plasma processing chamber and a signal processor coupled to the harmonic multiplexer. A first path in the multiplexer comprises a matching network adapted to provide energy to the plasma processing chamber. A second path in the multiplexer comprises a filter assembly connected to the signal processor and adapted to receive reflected energy from the plasma processing chamber.

BRIEF DESCRIPTION OF THE DRAWINGS

A more complete appreciation of the invention and many of the attendant advantages thereof will become readily apparent with reference to the following detailed description of embodiments of the invention, particularly when considered in conjunction with the accompanying drawings, in which.

DETAILED DESCRIPTION OF THE DISCLOSED EMBODIMENTS

A plasma processing system of the type to which this invention is applied includes a chamber which encloses a plasma region filled with an ionizable gas and into which RF electromagnetic energy is coupled. The energy interacts with the gas to initiate and sustain a plasma. One or more components can be provided to preferentially measure and control the energy contained in harmonics of the fundamental frequency of the RF energy coupled into and out of the plasma.

The plasma processing system contains a harmonic multiplexer that comprises a matching network and at least one filter in energy receiving communication with the plasma. The filter in the harmonic multiplexer separates harmonic frequencies from the fundamental frequency in the signal from the transmission line. Multiplexers are well known in the area of communications to separate signals from a transmission line into individual frequency components. Frequently a multiplexer and a demultiplexer are combined into a single device capable of processing both outgoing and incoming signals.

A unique electrical property of a harmonic multiplexer makes it electrically transparent to the matching network operating at a fundamental frequency and facilitates separation of harmonic frequencies from fundamentals as well as removal of harmonic frequencies from the processing chamber. A variety of different multiplexer configurations can be configured with the rest of the processing system. In each case, the multiplexer input port at the point of coupling to the RF feed (transmission) line can be matched to the source impedance of at least one harmonic frequency of interest. The multiplexer characteristic nominal output impedance provides a well-defined and convenient interface impedance for the harmonic level monitoring equipment as well as for supporting diagnostic tools.

After sampling the multiplexed signals from a transmission line, the harmonic frequencies can be dissipated using internal and/or external loads, and providing at the same time acceptable signal levels for processing purposes. In addition, the harmonic frequencies can be reflected by the diplexer by tuning the loads. By using a plasma harmonics detector with a specific algorithm, each of the matching networks can be tuned to achieve the best plasma uniformity results. Measuring the amount of power the plasma has available in its harmonic range makes a very subtle and precise measurement of the condition of the plasma.

Frequently, special attention needs to be devoted to the magnitude of the second harmonic. Levels as high as −3 dBc have been observed for the second harmonic during laboratory experiments. These high levels require the use of a high power second harmonic multiplexer and high power termination. The high power termination can comprise a load/coupler combination or a high power attenuator, which brings the power of the second harmonic down to manageable levels for further processing.

Figure 5:
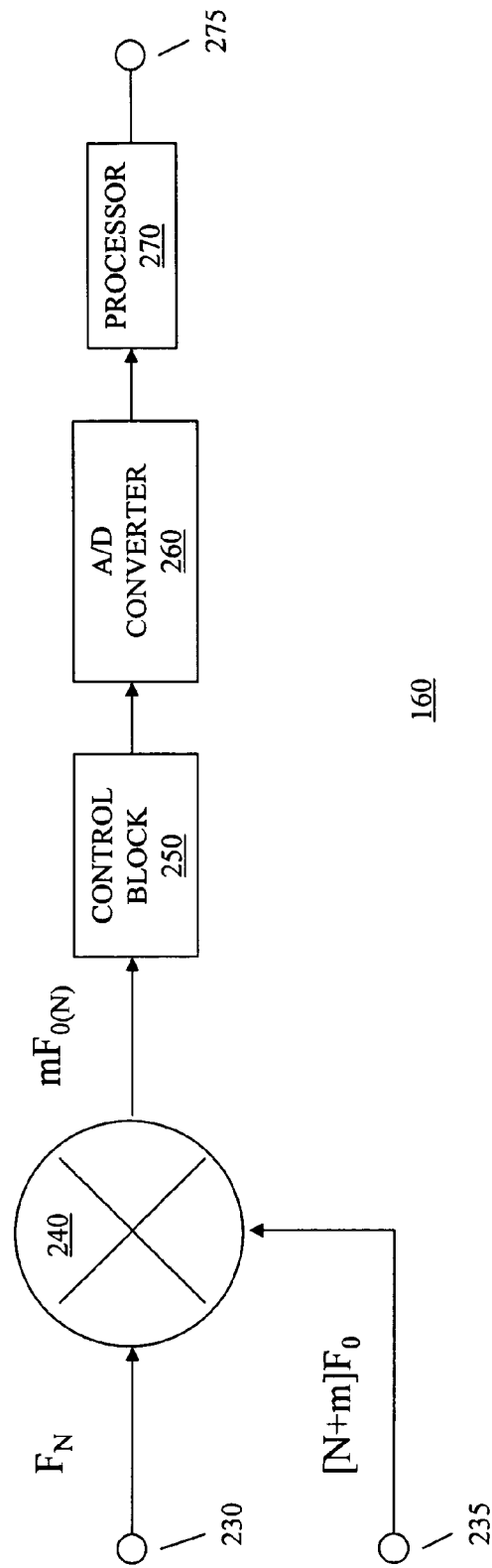
FIG. 5 is a simplified block diagram of a signal processor for processing fundamental and harmonic frequencies according to one embodiment of the present invention.
Figure 6:
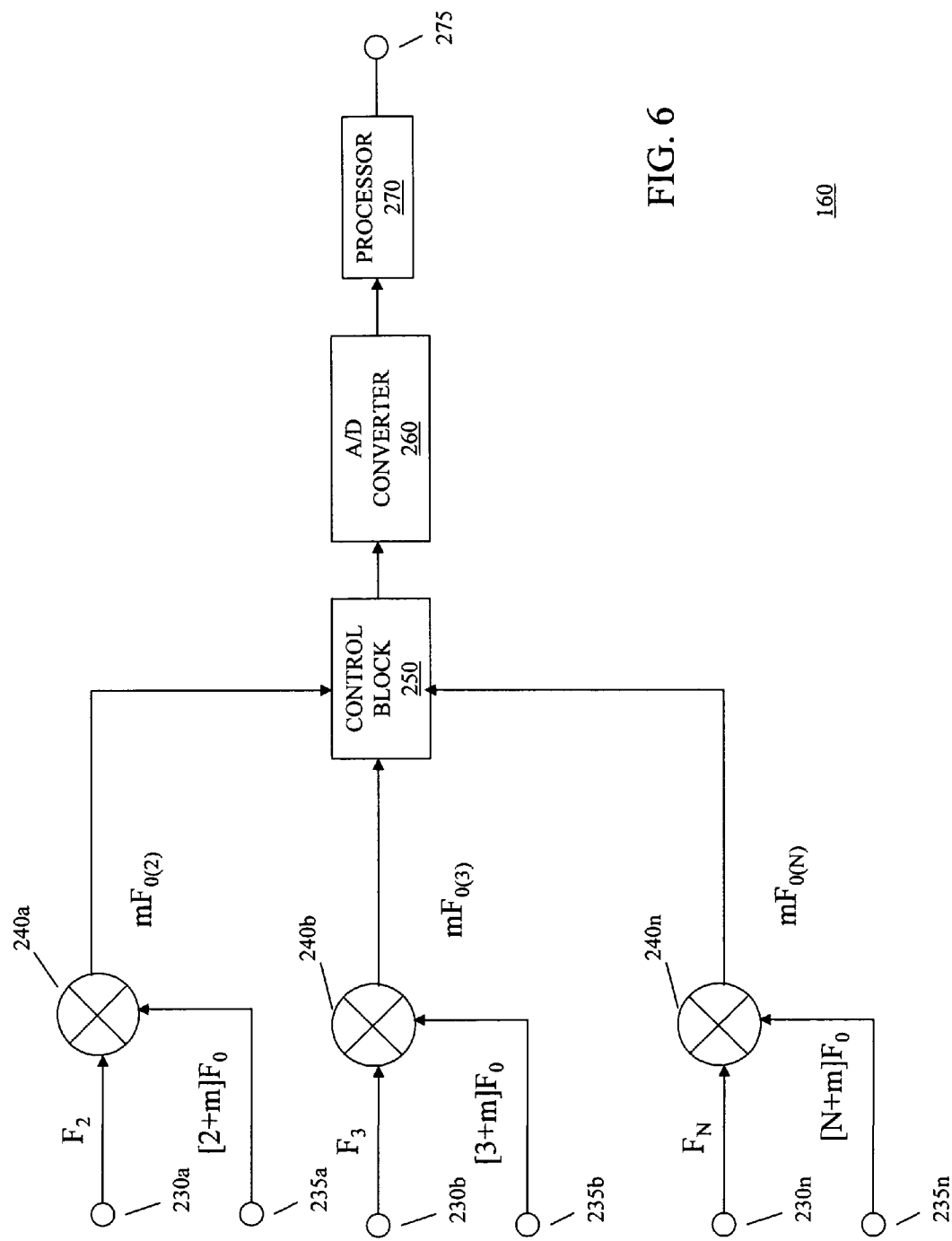
FIG. 6 is a simplified block diagram of a signal processor for processing frequencies from a plasma processing system according to another embodiment of the present invention.
Figure 7:
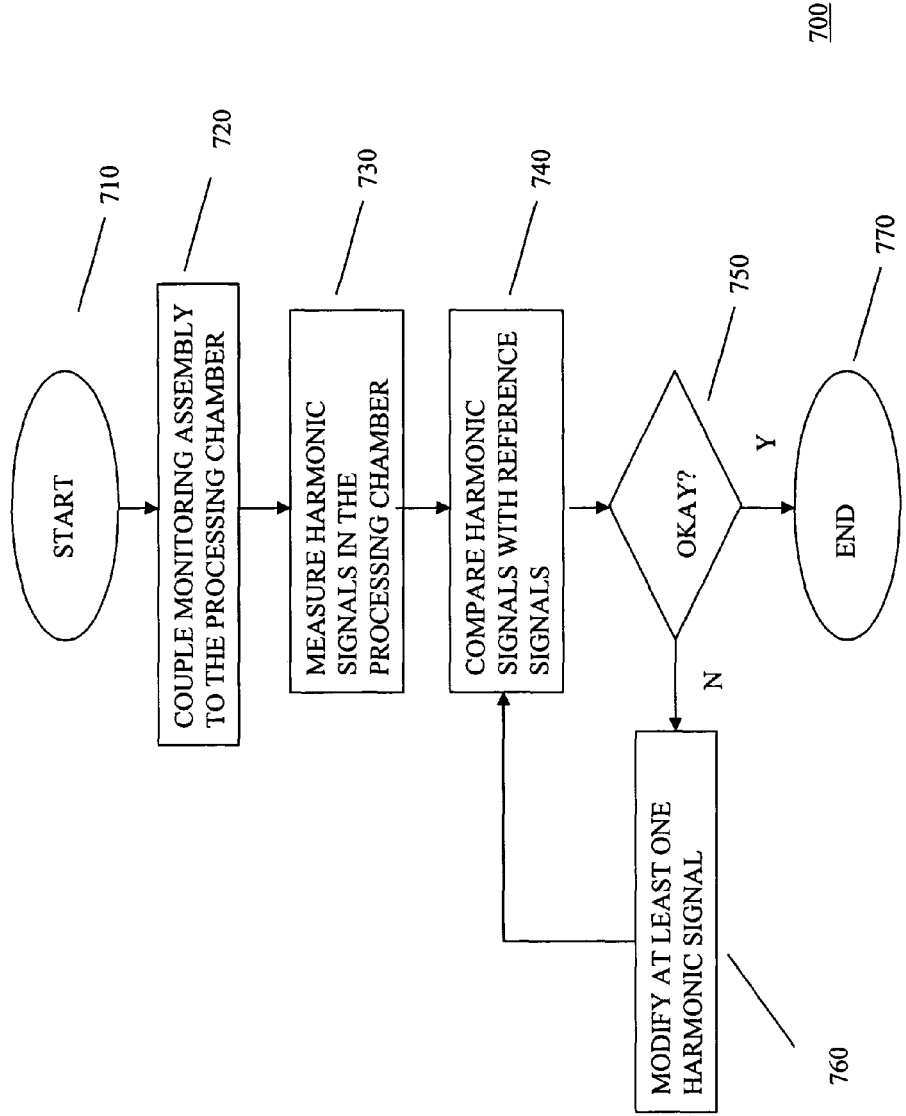
FIG. 7 is a flow diagram of a method for processing harmonic frequencies in a plasma processing system according to one embodiment of the present invention.

Different multiplexer configurations are illustrated in FIGS. 1–4. The configurations shown in FIGS. 1–4 vary in the way the harmonic frequencies are separated from the transmission line, for subsequent processing of the reflected signals. FIGS. 5–7 illustrate configurations for processing the reflected signals that are obtained from the methods in FIGS. 1–4. FIG. 5 describes down conversion of fundamental and harmonic frequencies into IF signals; FIG. 6 describes the processing details of an IF signal to extract signal magnitude and phase information; and FIGS. 7a and 7b describe the extraction and digitization of the information contained in IF signals. In the Figures, like reference numbers are used to indicate like elements throughout.

Figure 1:
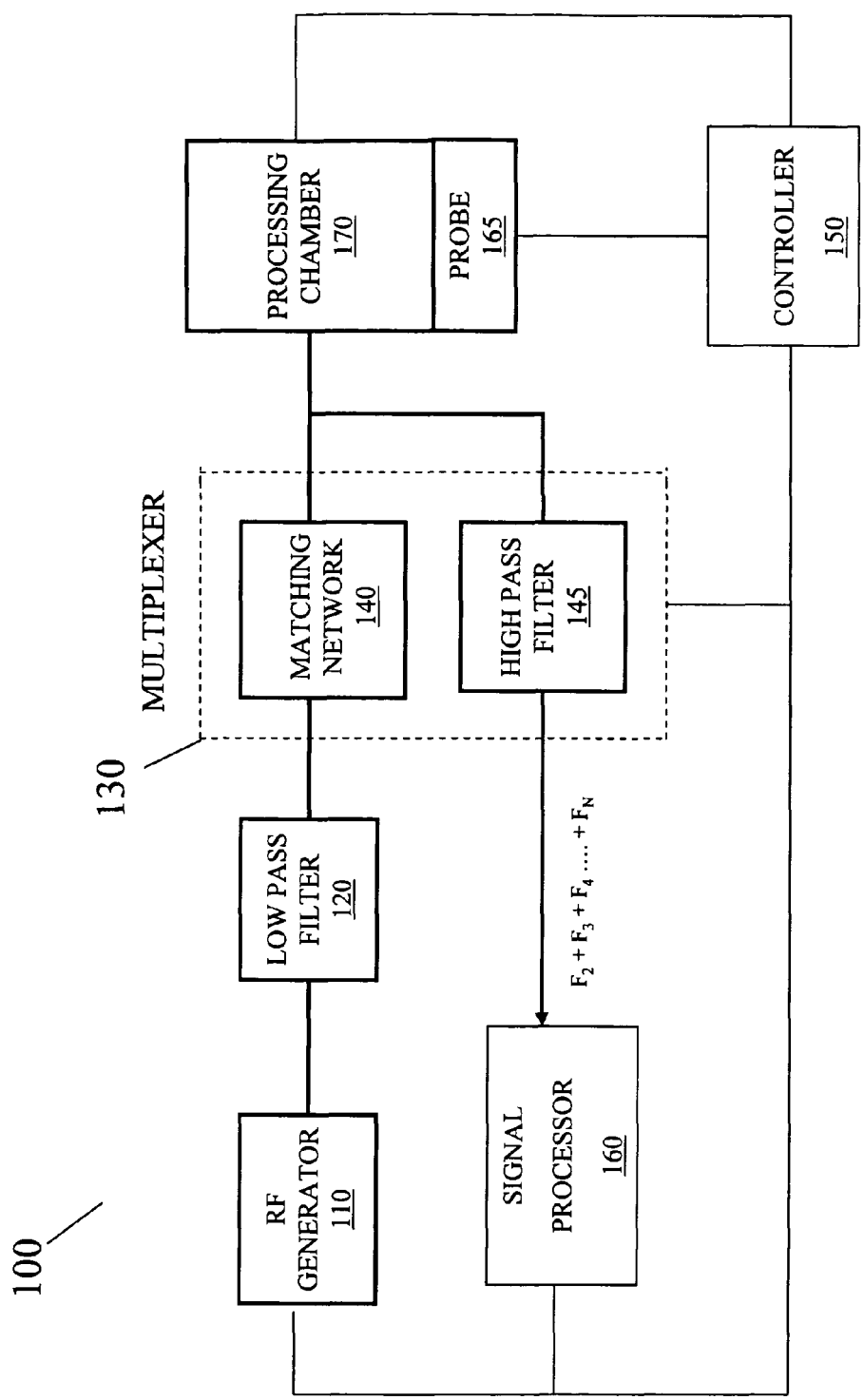
FIG. 1 is a simplified block diagram for processing harmonic frequencies in a plasma processing system according to one embodiment of the present invention.

FIG. 1 is a simplified block diagram for processing harmonic frequencies from a plasma processing system. The plasma processing system 100 comprises a plasma excitation RF generator 110 that supplies RF power at a fundamental frequency, a low pass filter 120, and a harmonic multiplexer 130. Harmonic multiplexer 130 comprises a matching network 140 and a high pass filter (HPF) 145 in energy receiving communication with the plasma by the way of connection to a transmission line coupled to the multiplexer 130 and the processing chamber 170. Probe 165 is also coupled to processing chamber 170. For example, probe 165 can comprise a V-I probe for diagnosing the processing chamber 170 by measuring power, load voltage, load current, and phase angle. Probe 165 may be coupled between matching network 140 and processing chamber 170. Alternately, probe 165 can comprise an optical or microwave diagnostic system.

The properties of the HPF 145 are chosen so as to pass harmonic frequencies ($F_2$, $F_3$, ... $F_N$), while rejecting the fundamental frequency ($F_0$). After separating the harmonic frequencies from the transmission line, the signals are further processed by the signal processor 160. For example, signal processor 160 can separate the individual harmonic frequencies, measure the amount of power present in the harmonic frequencies, and determine the conditions of the plasma process.

Signal processor 160 can include a microprocessor, a memory, and a digital I/O port capable of generating control voltages sufficient to communicate with controller 150 as well as monitor outputs from the multiplexer 130. A program stored in the memory is utilized to perform the aforementioned operations according to stored instructions. Alternately, signal processor 160 can comprise a Digital Signal Processor (DSP).

The plasma processing system 100 also comprises controller 150 that is coupled to RF generator 110, multiplexer 130, probe 165, processing chamber 170, and signal processor 160. Controller 150 can receive and transmit signals to and from RF generator 110, multiplexer 130, probe 165, processing chamber 170, and signal processor 160. For example, controller 150 can receive signals from signal processor 160 and used these signals to control a process in processing chamber 170.

Figure 2:
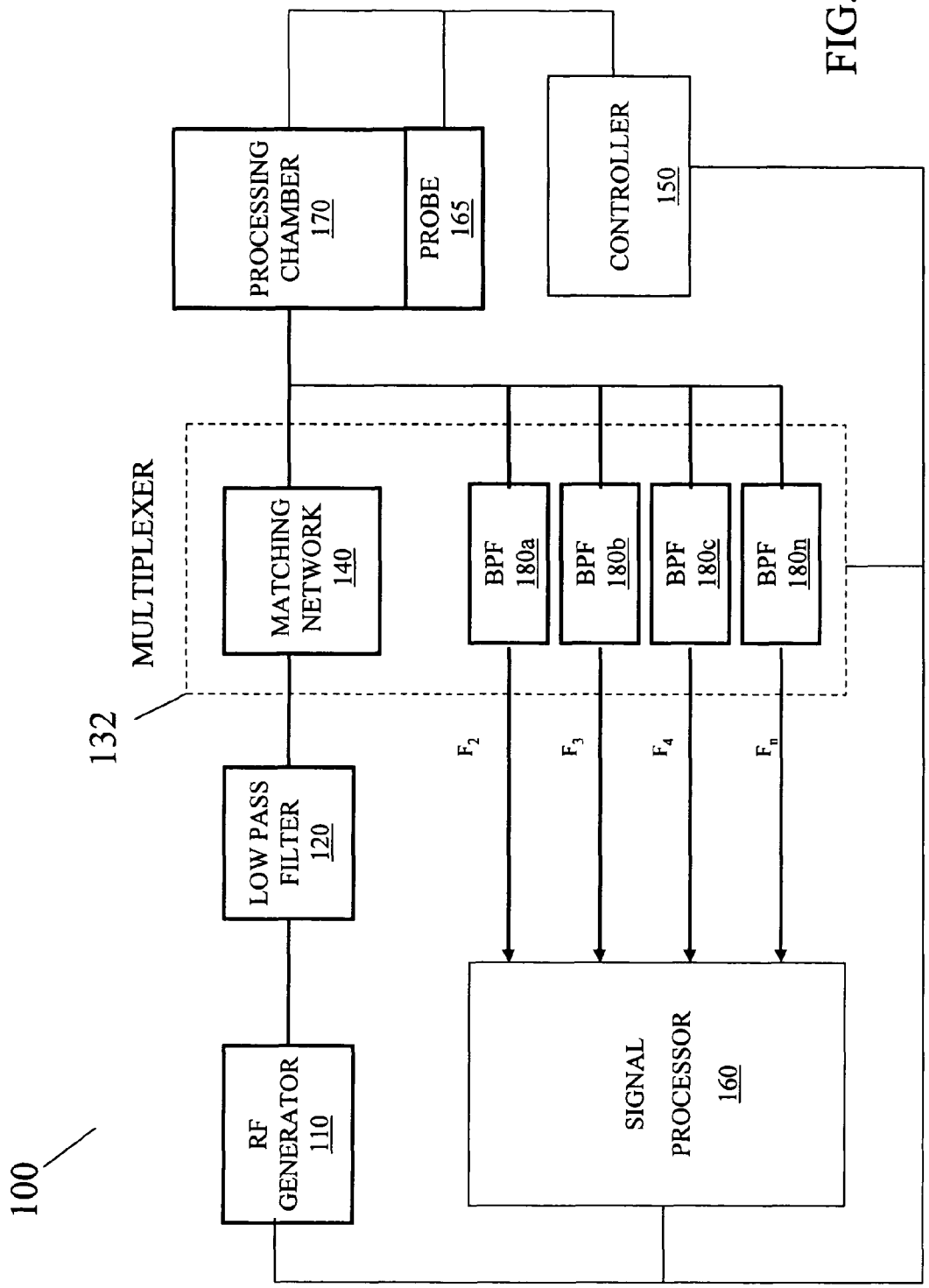
FIG. 2 is a simplified block diagram for processing harmonic frequencies in a plasma processing system according to an alternative embodiment of the present invention.

FIG. 2 is a simplified block diagram for processing harmonic frequencies in a plasma processing system according to an alternative embodiment. The harmonic multiplexer 132 comprises matching network 140 and multiple band pass filters (BPF) that are connected to the RF transmission line at a point between match network 140 and processing chamber 170. In FIG. 2, the HPF 145 from FIG. 1 has been replaced by BPF's 180a, 180b, ... 180n, where the properties of each BPF are chosen so as to pass a selected harmonic frequency, e.g., BPF 180a passes the second harmonic $F_2$ but rejects other frequencies on the transmission line. After separating the multiplexed signals from a transmission line, the harmonic frequencies are processed and analyzed using signal processor 160.

In an alternate embodiment, BPF's 180a, 180b, ... 180n are tunable and can be used to control the impedance presented to a particular harmonic. For example, a BPF can be tuned to pass variable amounts of harmonic power from the processing chamber to the signal processor. In this manner, harmonic levels within the processing chamber can be controlled and process uniformity can be enhanced.

Figure 3:
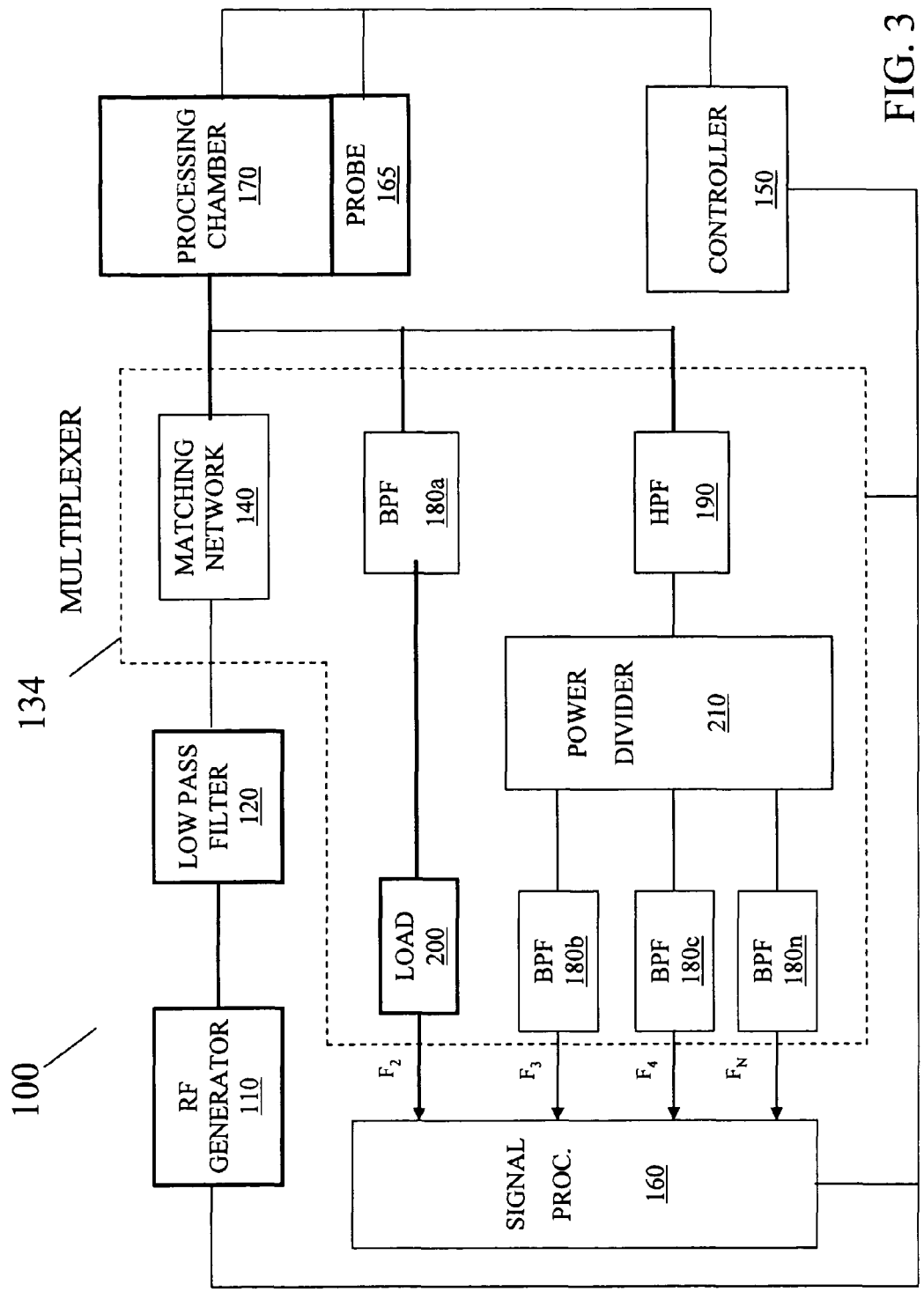
FIG. 3 is a simplified block diagram for processing harmonic frequencies in a plasma processing system according to an alternative embodiment of the present invention.

FIG. 3 is a simplified block diagram for processing harmonic frequencies in a plasma processing system according to an alternative embodiment of the present invention. The harmonic multiplexer 134 comprises matching network 140, and BPF 180a and HPF 190 that are connected to the RF transmission line at a point between match network 140 and processing chamber 170. The properties of the BPF 180a are chosen to transmit only the $2^{nd}$ harmonic frequency ($F_2$). Harmonic multiplexer 134 can also comprise load 200, power divider 210, and a plurality of BPFs (180b-180n). Load 200 can be coupled between BPF 180a and signal processor 160.

The embodiment illustrated in FIG. 3 can be utilized when special attention needs to be devoted to high magnitude of a particular harmonic frequency, for example the second harmonic ($F_2$). High power levels require the use of a high power termination that can comprise a load/coupler combination or a high power attenuator load 200, which brings the power of the second harmonic down to manageable levels for further processing by signal processor 160.

In the embodiment illustrated in FIG. 3, the properties of HPF 190 are chosen to pass harmonic signals at frequencies higher than F2 (e.g., $F_3$, $F_4$, ... $F_N$). The transmitted signals are routed through a power divider 210 and subsequently separated into frequencies $F_3$, $F_4$, ... $F_N$, using BPF's 180b, 180c, ... 180n, for further processing by signal processor 160.

Figure 4:
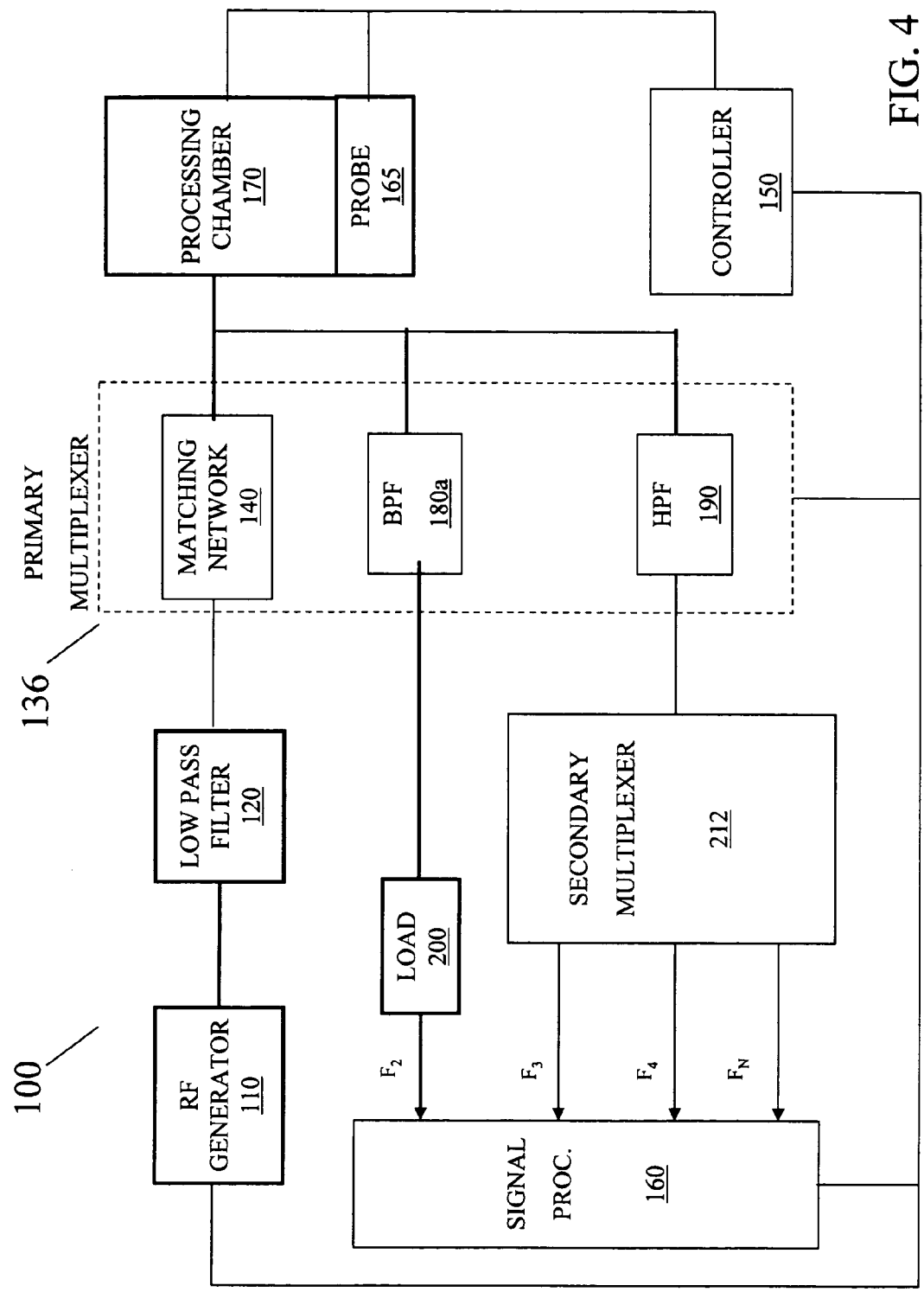
FIG. 4 is a simplified block diagram for processing harmonic frequencies in a plasma processing system according to an alternative embodiment of the present invention.

FIG. 4 is a simplified block diagram for processing harmonic frequencies in a plasma processing system according to an alternative embodiment of the present invention. The power divider 210 and BPFs (180b-180n) in FIG. 3 are replaced by a secondary multiplexer 212 for separating the transmitted harmonic frequencies $F_3$, $F_4$, ... $F_N$.

FIG. 5 is a simplified block diagram of a signal processor in accordance with one embodiment of the present invention. In the illustrated embodiment, signal processor comprises mixer 240 having two inputs 230 and 235. Input 230 can be coupled to a multiplexer output, and input 235 can be coupled to a frequency synthesizer that can be tuned across the required frequency bands to down convert the signal received at input 230.

Mixer 240 is also coupled to control block 250. For example, control block 250 can comprise at least one of a switching element, an amplifying element, a frequency control element, and a phase control element. In an alternate embodiment, control block 250 can comprise a plurality of V/I probes (not shown), where each V/I probe is coupled between a mixer and an A/D converter. Control block 250 is coupled to A/D converter 260, which is used to convert an analog signal into a digital signal. Processor 270 can be coupled to controller 150 using port 275. Processor 270 analyses the digital signals and calculates data associated with the harmonic signals. In one embodiment, the digital signals are in-phase (I) and quadrature phase (Q) signals. In addition, processor 270 can compare harmonic data with reference data from known good processes and can send results to controller 150.

Signal processor 160 in FIG. 5 can be connected to harmonic multiplexer 130 shown in FIG. 1, where the harmonic frequencies ($F_2, F_3, \ldots F_N$) are passed to the signal processor using HPF 145. The harmonic frequencies are processed in mixer 240 where they are down converter using synthesizer generated frequencies of a local oscillator to produce one or more characteristic IF signals ($mF_{0(N)}$). Alternatively, signal processor 160 in FIG. 5 can be connected to the multiplexer shown in FIG. 2, 3, or 4.

By properly selecting a fractional coefficient (m) and a frequency multiplier coefficient (N) for the synthesizer generated frequencies, it is possible to determine the value of the IF frequencies derived from the different harmonics and detect a variety of amplitude and phase relationships that exist between original frequencies. In FIG. 5, the character in the parenthesis following each $mF_0$ identifies the origin of an IF frequency. For example, the mixing of the FN harmonic signal with $(N+m)F_0$ from the synthesizer generated frequencies results in an $mF_{0(N)}$ IF signal.

The fractional coefficient (m) and a frequency multiplier coefficient (N) for the synthesizer generated frequencies can be easily modified to accommodate equipment with a different carrier frequencies resulting in a constant IF frequency and unchanged IF processing hardware for these systems.

FIG. 6 is a simplified block diagram of a signal processor 160 in accordance with another embodiment of the present invention. In the illustrated embodiment, signal processor 160 comprises mixers 240a, 240b, . . . 240n having two inputs 230a, 230b, . . . 230n and 235a, 235b . . . 235n. Inputs 230a, 230b, . . . 230n can be coupled to multiplexer outputs, and inputs 235a, 235b . . . 235n can be coupled to one or more frequency synthesizers that can be tuned across the required frequency bands to down convert the signals received at inputs 230a, 230b, . . . 230n.

Mixers 240a, 240b, . . . 240n can also be coupled to control block 250. For example, control block can comprise at least one of a switching element, an amplifying element, a frequency control element, and a phase control element. Control block 250 is coupled to A/D converter 260, which is used to convert an analog signal into a digital signal. Processor 270 can be coupled to controller 150 using port 275. Processor 270 analyses the digital signals and calculate data associated with the harmonic signals. In one embodiment, the digital signals are in-phase (I) and quadrature phase (Q) signals. In addition, processor 270 can compare harmonic data with reference data from known good processes and can send results to controller 150.

Signal processor 160 shown in FIG. 6 can be connected to harmonic multiplexer 132 shown in FIG. 2, where the harmonic frequencies ($F_2, F_3, \ldots F_N$) are removed from the transmission line using BPFs 180a, 180b, . . . 180n. The transmitted harmonic frequencies are processed in mixers 240a, 240b, . . . 240n where they are mixed with synthesizer generated frequencies of a local oscillator to produce characteristic IF signals ($mF_{0(N)}$). Alternatively, signal processor 160 in FIG. 6 can be connected to the multiplexer shown in FIG. 1, 3, or 4.

By properly selecting a fractional coefficient (m) and a frequency multiplier coefficient (N) for the synthesizer generated frequencies, it is possible to determine the value of the IF frequencies derived from the different harmonics and detect a variety of amplitude and phase relationships that exist between original frequencies. In FIG. 6, the character in the parenthesis following each $mF_0$ identifies the origin of an IF frequency. For example, the mixing of the FN harmonic signal with $(N+m)F_0$ from the synthesizer generated frequencies results in an $mF_{0(N)}$ IF signal.

The fractional coefficient (m) and a frequency multiplier coefficient (N) for the synthesizer generated frequencies can be easily modified to accommodate equipment with a different carrier frequencies resulting in a constant IF frequency and unchanged IF processing hardware for these systems.

The harmonic signals that are present on the transmission line can be processed using the method of down conversion of frequencies. These signals can contain a vast amount of data, but in many cases, the signal of interest represents only a small portion of that bandwidth. Down conversion and filtering allows some of the data to be discarded, which permits more intensive processing to be performed on the signal of interest. As a result of down conversion, electrical parameters are obtained that are related to the fundamental and harmonic frequencies at a single, constant IF frequency with preserved amplitude and phase relationships between these signals, reflecting parameters of the etching process.

Down conversion of harmonics to IF frequencies can be carried out by mixing (multiplying) selected transmitted harmonics ($F_2, F_3, \ldots F_N$) with synthesizer generated frequencies of a local oscillator, resulting in IF signals that are lower in frequency than the harmonics. For example, a frequency synthesizer can be locked to a reference/monitor frequency (e.g., the $F_0$ fundamental frequency) that is supplied by a RF generator in an etching system. Alternatively, in the case of etching systems that contain RF generators without a RF reference/monitor port, a local oscillator frequency synthesizer can be referenced to the sample of the actual carrier, or to the external fixed frequency generated by a crystal controlled reference oscillator.

The approach of generating local oscillator frequencies for down conversion process can be used by employing a fine impedance matching optimization method based on a moderate frequency alteration of the RF generator. Referencing a local oscillator frequency synthesizer to the RF generator's auxiliary RF reference/monitor port, guarantees constant IF frequencies during carrier frequency modification under fine impedance matching scenarios.

In order to apply the fine impedance matching feature described above, for equipment without provision for system's internal frequency referencing or actual carrier coupling schemes, one has to consider maximum acceptable deviation of the IF frequency, reflecting frequency excursions of the RF generator and related to it excursions of harmonic frequencies. This is especially important in view of a limited flat amplitude response and limited phase linearity of the IF bandpass filters in the passband region. This problem may be of particular concern in case of IF chains with a relatively narrowband fixed frequency bandpass filters.

In a analog signal processing scheme, software controlled analog switches can select any available IF frequencies for a phase comparison or amplitude level evaluation, providing good representation of the parameters reflecting properties and relationships either between fundamental and harmonic frequencies or between harmonic frequencies. The extracted parameters can in turn be correlated to the status of the etching process.

Placement of a narrowband BPF in each IF chain guarantees that only the frequency of interest is transmitted for further processing. A temperature compensation circuit can be used to provide IF chain performance that is independent of ambient temperature. In addition, phase control and gain control circuitry can be used to establish a reference point (magnitude and phase) for an IF frequency of known origin during calibration procedure. A quadrature hybrid circuit can be used to provide in-phase and quadrature-phase signals for magnitude and phase processing purposes.

FIG. 7 illustrates a flow diagram of a method for processing harmonic frequencies in a plasma processing system according to one embodiment of the present invention. Procedure 700 starts in 710.

In 720, a multiplexer is coupled to a processing chamber. For example, the multiplexer can comprise a matching network and at least one HPF and/or at least one BPF. In 730, a plurality of harmonic signals present in the processing chamber is measured. For example, a signal processor can be coupled to the multiplexer, and the signal processor can compute magnitude and phase data for the harmonic signals. In 740, the harmonic signals are compared with reference signals. For example, reference signals can comprised measured data for known good processes. In 750, a query is performed to determine if the comparison is okay. When the comparison is within the specified limits, procedure 700 branches to 770 and ends. When the comparison is not within the specified limits, procedure 700 branches to 760. In 760, at least one harmonic signal is modified. For example, one or more processing parameters can be changed to modify a harmonic signal. In addition, the multiplexer can be tuned to change the amount of absorption for a harmonic signal, and in this manner, the processing chamber can be tuned.

The processing of electrical parameters that are obtained from harmonic frequencies can be accomplished using analog, mixed (analog and digital), or exclusively digital techniques. Depending on the cost tradeoffs between analog and digital signal processing approaches, digital signal processing (DSP) can be implemented much earlier in the signal processing chain than shown in the Figures.

The quality of diagnostic tools that based on the above described processing system is strongly related to the degree and quality of the calibration process conducted during final stages of the manufacturing cycle of the etch equipment. The development of a limited number of high quality and very stable processes exclusively for the system's calibration purposes is therefore of extreme importance. During a system calibration procedure, absolute and relative magnitudes and absolute and relative phases of all measured IF frequencies should be adjusted using Gain and wide range Phase controls contained in each IF chain, in order to reflect uniform performance of all manufactured systems.

A controller 150 includes a microprocessor, a memory, and a digital I/O port capable of generating control voltages sufficient to communicate and activate inputs to the plasma processing system 100 as well as monitor outputs from the plasma processing system 100. A program stored in the memory is utilized to control the aforementioned components of a plasma processing system 100 according to a stored process recipe. One example of controller 150 is a DELL PRECISION WORKSTATION 610™, available from Dell Corporation, Dallas, Tex. Alternately, process performance controller 150 can comprise a Digital Signal Processor (DSP).

In addition to a controlling a wafer's etch uniformity, process personnel will acquire very valuable tool information from the amplitude and phase associated with each of the extracted harmonic signals. Absolute or relative values of these parameters can be considered for evaluation of etching process parameters, which can include, but is not limited to, the etch rate, etch uniformity, definition of the endpoint of a single process step, or definition of the endpoint of multiple process steps.

Evaluating and comparing the extracted parameters to a stored set of process parameter located in look-up tables, corresponding to known process condition, makes it possible to make a precise determination of process conditions. Parametric outputs, obtained from the processed signals, can be fed back to the microprocessor-based controller to improve the quality of the etching process (by making process adjustment) or to make exact determination of the current process status.

Numerous modifications and variations of the present invention are possible in light of the above teachings. It is therefore to be understood that, within the scope of the appended claims, the invention may be practiced otherwise than as specifically described herein.

What is claimed is:

1. A plasma processing system, comprising:
a monitoring assembly comprising a harmonic multiplexer and signal processor, wherein a first path in the harmonic multiplexer is used to provide RF power from a RF source to a plasma generating component in a plasma chamber, the first path comprising a matching network coupled between the RF source and the plasma generating component, and wherein a second path in the harmonic multiplexer is used to monitor RF power reflected from the plasma chamber, the second path comprising a filter assembly configured to separate harmonic frequencies from a fundamental frequency, the filter assembly being coupled between the plasma generating assembly and the signal processor.

2. The improved plasma processing system as claimed in claim 1, wherein the signal processor comprises a down converter coupled to the filter assembly for converting a RF signal to a IF signal, an A/D converter for converting the IF signal to a digital signal, and a processor for processing the digital signal.

3. The improved plasma processing system as claimed in claim 2, wherein the down converter comprises a tunable front-end for converting at least one harmonic frequency to the IF signal.

4. The improved plasma processing system as claimed in claim 1, wherein the RF source provides RF power at a fundamental frequency and the filter assembly comprises a high pass filter that attenuates reflected RF power at the fundamental frequency.

5. The improved plasma processing system as claimed in claim 1, wherein the RF source provides RF power at a fundamental frequency and the filter assembly comprises a plurality of band pass filters, each bandpass filter passing reflected RF power at one harmonic of the fundamental frequency and attenuating reflected RF power at the fundamental frequency and other harmonic frequencies.

6. The improved plasma processing system as claimed in claim 5, wherein the signal processor comprises a plurality of down converters, each down converter coupled to one of the bandpass filters for converting a harmonic signal to a IF signal, an A/D converter for converting the IF signal to a digital signal, and a controller for processing the digital signal.

7. The improved plasma processing system as claimed in claim 6, further comprising a switch between the plurality of down converters and the A/D converter.

8. The improved plasma processing system as claimed in claim 5, wherein the signal processor comprising a plurality of down converters, a plurality of IF bandpass filters, a plurality of control modules, a plurality of A/D converters, and a processor, wherein each down converter is coupled to one of the harmonic multiplexer bandpass filters for converting a harmonic signal to a IF signal, an IF bandpass filter is coupled to each down converter, a control module is coupled to each IF bandpass filter, an A/D converter is coupled to each control module for converting the IF signal to a digital signal, and the processor is coupled to the plurality of A/D converters for processing digital signals.

9. The improved plasma processing system as claimed in claim 5, the signal processor comprising a plurality of V/I probes, a plurality of A/D converters, and a controller, wherein each V/I probe is coupled to one of the multiplexer bandpass filters for converting a harmonic signal to a voltage signal and a current signal, an A/D converter is coupled to each V/I probe for converting the voltage signal to a digital signal, another A/D converter is coupled to each V/I probe for converting the current signal to a digital signal and a controller is coupled to the plurality of A/D converters for processing digital signals.

10. The improved plasma processing system as claimed in claim 1, wherein the RF source provides RF power at a fundamental frequency and the filter assembly comprises:
 a bandpass filter, the bandpass filter passing reflected RF power at the second harmonic of the fundamental frequency and attenuating reflected RF power at the fundamental frequency and other harmonic frequencies, and
 a highpass filter, the highpass filter passing reflected RF power at frequencies higher than the second harmonic of the fundamental frequency to the signal processor and attenuating reflected RF power at the fundamental frequency and the second harmonic frequency.

11. The improved plasma processing system as claimed in claim 10, wherein the monitoring assembly further comprises:
 a load coupled to the bandpass filter and the signal processor, the load absorbing the reflected RF power at the second harmonic of the fundamental frequency;
 a power divider coupled to the highpass filter; and
 a plurality of band pass filters, each bandpass filter passing reflected RF power at a harmonic frequency above the second harmonic frequency to the signal processor and attenuating reflected RF power at the other harmonic frequencies.

12. The improved plasma processing system as claimed in claim 10, wherein the monitoring assembly further comprises:
 a load coupled to the bandpass filter and the signal processor, the load absorbing the reflected RF power at the second harmonic of the fundamental frequency; and
 a second harmonic multiplexer coupled to the highpass filter, the second harmonic multiplexer comprising a plurality of outputs, each output passing reflected RF power at a harmonic frequency above the second harmonic frequency to the signal processor and attenuating reflected RF power at the other harmonic frequencies.

13. A plasma processing system comprising:
chamber enclosing a plasma region;
plasma generating component disposed in the chamber in communication with the plasma region;
source of RF power having at least one fundamental frequency; and
monitoring assembly comprising:
 a harmonic multiplexer disposed in energy-receiving communication with the system component, and
 a signal processor coupled to the harmonic multiplexer, wherein a first path in the harmonic multiplexer is used to provide RF power from a RF source to the plasma generating component in the chamber, the first path comprising a matching network coupled between the RF source and the plasma generating component, and wherein a second path in the harmonic multiplexer is used to monitor RF power reflected from the chamber, the second path comprising a filter assembly configured to separate harmonic frequencies from a fundamental frequency, the filter assembly being coupled between the plasma generating assembly and the signal processor.

14. The plasma processing system as claimed in claim 13, wherein the RF source provides RF power at a fundamental frequency and the filter assembly comprises a plurality of band pass filters, each bandpass filter passing reflected RF power at one harmonic of the fundamental frequency and attenuating reflected RF power at the fundamental frequency and other harmonic frequencies.

15. A monitoring assembly for monitoring a plasma process in a plasma processing chamber, the monitoring assembly comprising:
 a harmonic multiplexer adapted to communicate energy to and from the plasma processing chamber; and
 a signal processor coupled to the harmonic multiplexer, wherein a first path in the harmonic multiplexer comprises a matching network adapted to provide energy to the plasma processing chamber, and wherein a second path in the harmonic multiplexer comprises a filter assembly connected to the signal processor and adapted to receive reflected energy from the plasma processing chamber and separate harmonic frequencies from a fundamental frequency.

16. The monitoring assembly as claimed in claim 15, wherein the filter assembly comprises a plurality of band pass filters, each bandpass filter passing reflected RF power at one harmonic of a fundamental frequency and attenuating reflected RF power at the fundamental frequency and other harmonic frequencies.

* * * * *